United States Patent [19]
Vallancourt

[11] Patent Number: 6,020,769
[45] Date of Patent: *Feb. 1, 2000

[54] LOW VOLTAGE SAMPLE AND HOLD CIRCUITS

[75] Inventor: David Gerard Vallancourt, Middletown, N.J.

[73] Assignee: Lucent Technologies, Inc., Murray Hill, N.J.

[ * ] Notice: This patent is subject to a terminal disclaimer.

[21] Appl. No.: 08/953,188

[22] Filed: Oct. 17, 1997

[51] Int. Cl.[7] .................................................. G11C 27/02
[52] U.S. Cl. ............................................... 327/94; 327/96
[58] Field of Search ................................ 327/91, 93, 94, 327/95, 96, 309, 312, 333, 390; 341/122–125; 365/203

[56] References Cited

U.S. PATENT DOCUMENTS 4,886,986  12/1989  Watanabe ................................... 327/94
5,225,836  7/1993  Morley, Jr. et al. ..................... 341/150
5,572,153  11/1996  Vallancourt et al. ..................... 327/77
5,736,879  4/1998  Pham ....................................... 327/102

*Primary Examiner*—My-Trang Nu Ton

[57] ABSTRACT

A very low voltage sampling circuit which is capable of a full ranging output when powered with a very low voltage, e.g., of about 1 volt. A pre-charge circuit is combined with a sample and hold circuit to avoid the need for low threshold switching devices in the sampling circuit, thus avoiding output droop due to the increased leakage of low threshold devices. The pre-charge circuit is placed between the sample and hold circuit and an output of the sampling circuit to 'boost' the voltage level of the output of the sample and hold circuit to above a predetermined threshold voltage level. The pre-charge circuit includes an output voltage boost capacitor which is charged before the hold cycle of the sampling circuit. The negative node of the output voltage boost capacitor is charged to a reference voltage based on a range of correction for the output voltage, and the positive node is charged approximately to a level of the input signal itself.

28 Claims, 5 Drawing Sheets

LOW VOLTAGE SAMPLE AND HOLD CIRCUITS

This application is being co-filed with similar application Ser. No. 08/953187, entitled "Low Voltage Sample and Hold Circuits", and with similar application Ser. No. 08/953,551, entitled "Low Voltage Sample and Hold Circuits", both of which are explicitly incorporated herein by reference.

BACKGROUND OF THE INVENTION

1. Field of the Invention

This invention relates to circuits for, and methods of, sampling a time-varying input signal. More particularly, it relates to sample and hold circuits for use with a total power supply voltage which is as low as just a few tenths of a volt greater than the threshold voltage of MOS transistors used in the sample and hold circuits.

2. Background of Related Art

The portability of electronic devices is an important feature in today's society, e.g., as evidenced by the popularity of handheld portable cellular telephones. However, as is well known, a significant portion of the size and weight of a portable electronic device is required just for the power supply of the portable electronic device. To reduce its size and/or to increase its operational time between charges, it is desired that power consumption of portable electronic devices be minimized. One way of accomplishing this goal is to reduce the voltage level of the power supply. In some instances it is required that the voltage level of the power supply be reduced not only to minimize power consumption but also to comply with the low level electrical limits of fine-line integrated circuit technology, which is now approaching line widths of less than 0.1 μm. The circuitry and line widths in such highly integrated devices are scaled down accordingly, based on the desired power supply level. Thus, while previous portable electronic devices typically utilized 5 volt power supplies, power supply levels have more recently decreased to about 3 volts, and most recently approached a total power supply of 1.0 volt for many portable electronic devices.

At very low power supply voltages, analog functions become difficult to implement using MOS transistors exhibiting standard threshold levels. To turn on an n-channel transistor switch, a voltage greater than the signal being passed through its channel plus its threshold voltage $V_{T,n}$ must be present at its gate. For a p-channel transistor switch, a voltage less than the power supply voltage minus its threshold voltage $V_{T,p}$ must be present at its gate.

Conventional CMOS processes feature n-channel devices exhibiting a 0.7 volt threshold, and p-channel devices exhibiting a 1.0 volt threshold. For a p-channel transistor to operate as a switch, its gate voltage must be at a level at least one threshold voltage $V_{T,p}$ below the signal passed through its channel. With a 1 volt total power supply, the entire supply voltage is necessary just to turn the p-channel transistor device ON. The p-channel MOS transistor device 402 would be virtually useless if employed as a switch with such a low power supply voltage because, as shown in FIG. 6A, it would never turn ON.

On the other hand, although a 1 volt power supply would have sufficient range to turn an n-channel MOS transistor device 404 ON, FIG. 6B shows that only about 30% (i.e., 0 to 0.3 volts) of the available signal range (0 to 1 volt) would pass therethrough.

Threshold voltages of standard MOS transistor devices can be lowered using more costly manufacturing processes, but still exhibit disadvantages when utilized in sample and hold circuits. For example, using conventional 0.35 μm, 3 volt technology, an n-channel transistor device has a lower threshold voltage of about 0.5 volts. When operating as a switch, the n-channel transistor switch can pass signals from about 0 volts to 0.5 volts with a 1 volt power supply. On the other hand, a p-channel transistor device using this technology has a lower threshold voltage of about 0.8 volts. Thus, the lower threshold voltage p-channel transistor switch can pass signals from about 0.8 volts to 1.0 volt using the same 1 volt power supply.

Even if these lower threshold voltage devices are used in parallel using a 1 volt power supply, voltage inputs in the range of about 0.5 volts to 0.8 volts still cannot be passed by either the lower threshold voltage p-channel or the n-channel transistor devices, and thus would not be sampled properly.

The 1 volt power supply discussed herein may be a battery cell which is 1.2 volts when new, but discharges to about 1.0 volt over its useful life.

MOS transistor switches are commonly employed in sample and hold circuits. A sample and hold (S/H) circuit repeatedly captures and maintains a single sample of either the current or voltage of a time-varying signal long enough for an analog-to-digital converter (ADC) or other subsequent circuit to utilize that stabilized sample. Without a sample and hold circuit, the accuracy of the ADC or other circuitry following the sample and hold circuit would deteriorate due to their vulnerability to fluctuations in the input signal during the length of time that the sample is being utilized by subsequent circuitry.

FIG. 7 shows a conventional current sample and hold circuit, including an operational amplifier (op amp) OA1, a standard threshold MOS transistor device M1 operated as a switch, and a hold capacitor $C_H$. The sample and hold circuit feeds a load switch ML and a load resistance $R_L$ during an active portion of a HOLD signal. The switch M1 is operated under the control of a sampling signal SAMP input to the gate of switch M1. When the sampling signal SAMP is active, i.e., at a logic 1, switch M1 allows the output of the op amp OA1 to pass and charge the hold capacitor $C_H$. The load switch is operated under the control of the HOLD signal.

The op amp OA1 itself is a conventional device capable of a full output range from 0 volts up to the full level of the power supply, even with a 1 volt power supply. However, because of the ON threshold voltage of switch M1, the range of the charge voltage $V_{CH}$ passed by switch M1 and charged on the hold capacitor $C_H$ is limited to between about 0 and 0.3 volts. Thus, switch M1 allows only about 30% of the available signal range of 0 to 1.0 volts provided by the 1 volt voltage supply to pass and charge the hold capacitor $C_H$. Even if switch M1 were to be a device having a lower ON threshold voltage improving the range of the charge voltage $V_{CH}$ across the hold capacitor $C_H$, increased leakage current through switch M1 in the OFF condition would disadvantageously degrade the accuracy of the current sampling circuit. This is because it is difficult if at all possible for a low threshold voltage transistor device to be turned OFF completely.

If the n-channel switch M1 in the circuit of FIG. 7 is a standard threshold voltage device, i.e., having an ON threshold voltage of about 0.7 volts, then the range of charge voltage $V_{CH}$ will be only about 0 to 0.3 volts. In this case, the charge voltage $V_{CH}$ will reach the upper limit of its range at 0.3 volts.

If, on the other hand, switch M1 in the circuit of FIG. 7 is a low threshold voltage transistor device exhibiting an ON threshold voltage of, e.g., about 0.3 volts, the voltage range of the hold capacitor $C_H$ will be considerably improved to be 0 to 0.7 volts and be capable of charging to any level within the range of the output voltage $V_O$ of the op amp OA1, i.e., 0 to 0.7 volts. However, the increased ON leakage of the low threshold voltage switch M1 is nevertheless a disadvantage. Unfortunately, even when using a low threshold switch M1, the uppermost portion of the full range of the output voltage $V_O$ of the op amp OA1, i.e., 0.7 to 1 volt, cannot be sampled.

Thus, when used as switches, low threshold MOS transistor devices can improve considerably the range, of the output drive of a sample and hold circuit. However, low threshold MOS transistor devices are generally more costly to process than are normal threshold MOS transistor devices, and exhibit undesirable leakage current in the OFF condition as compared to normal threshold MOS transistor devices. In fact, the low threshold MOS transistor switch is a poor sample and hold element because it is difficult and sometimes impossible to turn a low threshold MOS device completely OFF. Furthermore, despite the lower threshold, low threshold MOS transistor devices nevertheless constrict the available signal range to less than that provided by a very low voltage power supply.

One conventional technique 'bootstraps' the gate drive voltage of the MOS transistor switch to a value greater than the supply voltage. This works for integrated circuit technologies that can function without breakdown at these higher voltages, i.e., with signal voltages above the power supply voltage, but cannot be utilized with very fine-line integrated circuit technologies such as 0.1 $\mu$m technology because of the smaller scale and limited electrical capability of the wiring and components. Therefore, bootstrapping of the gate drive voltage is not a preferred technique, particularly as it is not applicable to 0.1 $\mu$m and smaller fine line technology.

Another conventional system is the well known "switched op amp", in which an entire amplifier is actively switched, i.e., turned ON to charge the hold capacitor $C_H$, and switched OFF during the hold phase of the sample and hold operation. FIG. 8 shows a conventional closed-loop, switched op amp, voltage sample and hold circuit. In FIG. 8, a closed-loop, non-inverting amplifier OA2 features an output stage that can be tri-stated under control of a tri-state signal TR1. When not tri-stated, op amp OA2 charges hold capacitor $C_H$. When tri-stated by an active or logic 1 state of tri-state signal TR1, the charge voltage $V_{CH}$ developed across the hold capacitor $C_H$ before the op amp OA2 was tri-stated provides a stable output sample of the input voltage $V_{IN}$.

The conventional closed-loop, switched op amp, voltage sample and hold circuit shown in FIG. 8 provides rail-to-rail sampling outputs even when sufficient logic drive is not available for MOS transistor switches. Unfortunately, the output stage of the op amp OA2 must be shut down carefully. For instance, any mismatch in timing between the n-channel shutoff and the p-channel shut off of the amplifier output stage will inject an error charge onto the hold capacitor $C_H$, disturbing its charge voltage $V_{CH}$ and thus the output of the sample and hold circuit. It is possible for this disturbance to be quite large.

Thus, there is a need for sampling circuits which are capable of accurate and full-ranging operation with a very low power supply voltage.

SUMMARY OF THE INVENTION

A sampling circuit is disclosed which is particularly advantageous for use with a very low power supply voltage. The sampling circuit includes an op amp, with an output voltage boost capacitor in communication with a first output of the op amp. A pre-charge circuit pre-charges the output voltage boost capacitor to provide a boosted output voltage.

A method of sampling an input signal is also disclosed wherein an output voltage boost capacitor is pre-charged to a boost voltage level. A first output of the op amp is switched to a first state to charge a hold capacitor, then switched to a second state to allow the hold capacitor to hold the charge. The output of the op amp boosts the output signal by voltage level on the output voltage boost capacitor to provide a boosted output signal.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention combines the functions of a sample and hold circuit with those of a current copier or dynamic current mirror circuit to provide an advantageous sampling circuit which can operate with a very low power supply voltage.

In a typical current copier or dynamic current mirror circuit, an input current is applied to the drain of a metal oxide semiconductor (MOS) transistor device while its gate is driven by a feedback circuit to the voltage level necessary to sustain that input drain current. The value of the gate voltage is not of concern as long as the applied drain current can indeed be achieved and sustained by the level of the gate voltage. The use of a current copier in a sampling circuit according to the present invention provides a full-ranging output capability up to the level of even a very low power supply, e.g., a 1 volt source.

First Embodiment

Figure 1:
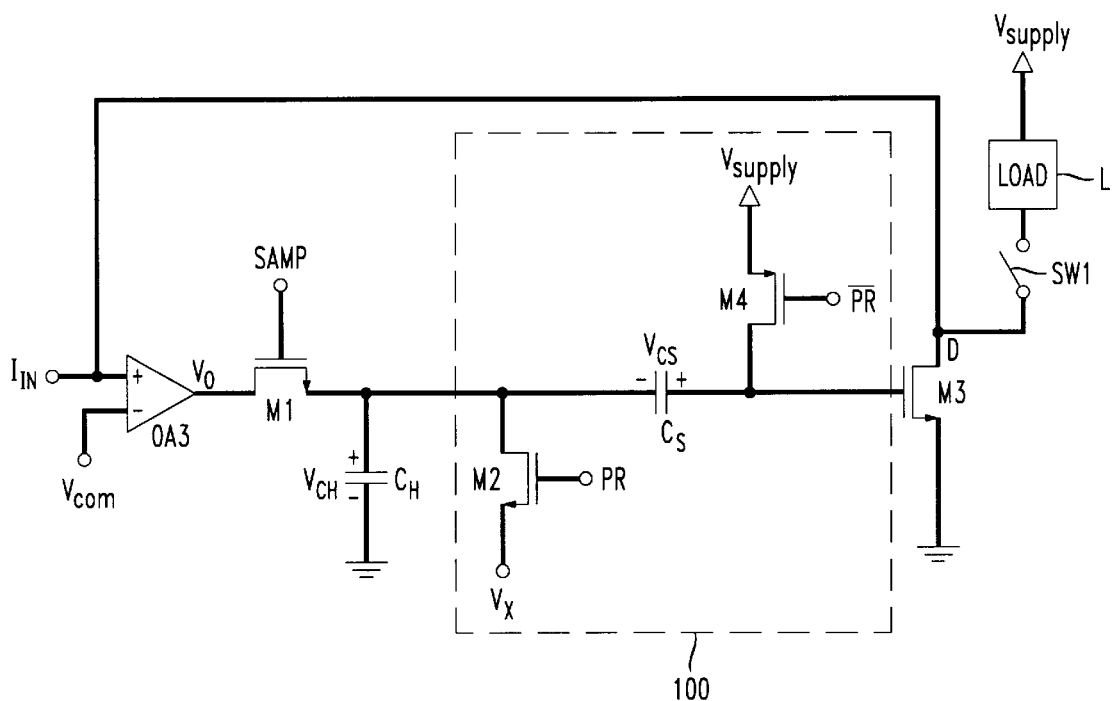
FIG. 1 shows, in a first embodiment of the present invention, a current sampling circuit for use with a very low voltage power supply.
Figure 8:
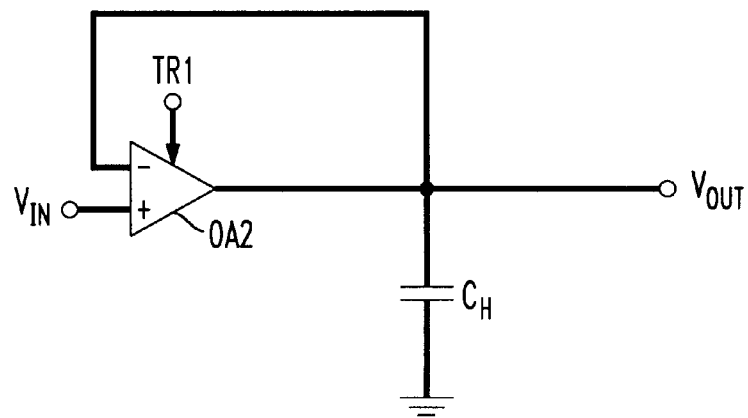
FIG. 8 shows a conventional closed-loop switched op amp sample and hold circuit.

FIG. 1 shows a current sampling circuit utilizing a current copier according to a first embodiment of the present invention. This embodiment includes an op amp OA3, a MOS transistor switch M1, and a hold capacitor $C_H$ in a similar configuration to the conventional circuit shown in FIG. 8. However, in FIG. 1 a pre-charge circuit 100 is added to the output of the hold capacitor $C_H$ to boost the level of the voltage at the gate of a current storage MOS transistor M3. Current storage MOS transistor M3 operates as a dynamic current mirror.

The pre-charge circuit 100 includes an n-channel MOS transistor M2, an output voltage boost capacitor $C_s$, and a p-channel MOS transistor M4. The n-channel and p-channel MOS transistors M2, M4 are standard threshold voltage devices.

The p-channel MOS transistor M4 is operated as a switch under the control of inverse pre-charge signal /PR input to its gate, and the n-channel MOS transistor M2 is operated as a switch under the control of pre-charge signal PR input to its gate.

Pre-charge signal PR and the inverse of pre-charge signal /PR are simultaneously active and simultaneously inactive. Thus, switch M2, which is controlled by pre-charge signal M2, and switch M4, which is controlled by the inverse pre-charge signal /PR, are closed simultaneously by the simultaneously active pre-charge signals PR and /PR, and are opened simultaneously by the simultaneously inactive pre-charge signals PR and /PR.

The negative node of the output voltage boost capacitor $C_S$ is further connected to the positive node of the hold capacitor $C_H$, and the positive node of the output voltage boost capacitor $C_S$ is further connected to the gate of the current storage MOS transistor M3. The source of the current storage MOS transistor M3 is grounded, while its drain is fed back to the non-inverting input of op amp OA3.

The source of switch M4 is connected to the very low power supply voltage $V_{SUPPLY}$, while its drain is connected to the positive node of the output voltage boost capacitor $C_S$. Switch M4 provides a switchable electrical path between the positive node of the output voltage boost capacitor $C_S$ and the very low power supply voltage $V_{SUPPLY}$.

The source of switch M2 is connected to a reference voltage $V_X$. Switch M2 provides a switchable electrical path between the reference voltage $V_X$ and the negative node of the output voltage boost capacitor $C_S$.

The inverting input of the op amp OA3 is connected to common-mode voltage $V_{COM}$, which is a convenient circuit common-mode voltage, e.g., 0.7 volts.

The output current of the circuit of FIG. 1 drives a load, generally depicted at L, which may be connected to the supply voltage $V_{SUPPLY}$ as shown, to ground, or to other circuitry (not shown). The current to the load L is switched by an ideal switch SW1 in known ways.

In operation, the output of op amp OA3 charges the hold capacitor $C_H$ when switch M1 is turned ON by a positive or logic high level of sampling signal SAMP. However, as discussed above, the ON threshold voltage of switch M1 limits the voltage range of the signal passed from the op amp OA3 to between 0 and about 0.7 volts using standard threshold technology. When switches M2 and M4 are turned ON, the negative node of the output voltage boost capacitor $C_S$ is charged to approximately the level of the reference voltage $V_X$, and its positive node is charged to approximately the level of the very low voltage power supply $V_{SUPPLY}$. Thus, the pre-charge circuit 100 boosts the 0 to 0.3 volt output from switch M1 to a voltage level higher than the threshold voltage of the current storage MOS transistor device M3 such that the entire output range of the op amp OA3 is utilized by the sampling circuit.

Figure 2:
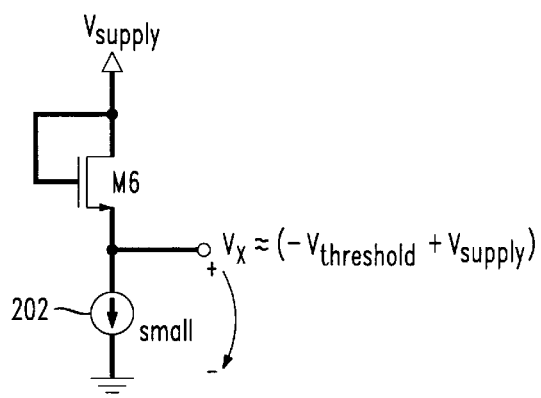
FIG. 2 shows a circuit for generating the reference voltage $V_x$ for the circuit shown in FIG. 1.

FIG. 2 shows an example of a circuit for generating reference voltage $V_X$, which is the voltage to which the negative node of the output voltage boost capacitor Cs is charged before sampling commences. An n-channel MOS transistor M6 is connected with its drain and gate connected to the power supply voltage $V_{SUPPLY}$, and its source forming a current source through a load 202. The voltage level of the source of the n-channel MOS transistor M6 is about equal to the supply voltage $V_{SUPPLY}$ minus the threshold voltage of the n-channel MOS transistor M6. The threshold voltage of the n-channel MOS transistor M6 should be approximately equal to the threshold voltage of the current storage MOS transistor M3. Thus, if a standard threshold voltage device is used as the current storage MOS transistor M3 (as in the present embodiment), then the n-channel MOS transistor M6 should also be a standard threshold voltage device. Accordingly, in the disclosed embodiment, the reference voltage $V_X$ is about 0.3 volts.

$$V_{SUPPLY} - V_{T,N} = 1.0v - 0.7v = 0.3v$$

When the pre-charge signals PR and /PR are active at the gates of switches M2, M4, respectively (FIG. 1), output voltage boost capacitor Cs is charged to a boost voltage $V_{cs}$ about equal to:

$$V_{CS} = V_{SUPPLY} - V_X$$

Using a reference voltage $V_x$ as shown in FIG. 2, $V_{cs}$ becomes equal to the ON threshold voltage of n-channel MOS transistor M6, or about 0.7 volts.

$$V_{CS} = V_{T,n} = 0.7v$$

During the time that the pre-charge signals PR and /PR are active, sampling signal SAMP is inactive and thus switch M1 is OFF. Thereafter, pre-charge signals PR and /PR go inactive, i.e., pre-charge signal PR goes to a logic low state and inverse pre-charge signal /PR goes to a logic high state. Switches M2 and M4 are then turned OFF. Accordingly, the output voltage boost capacitor $C_S$ is charged to about 0.7 volts.

After the output boost voltage capacitor $C_S$ is pre-charged, sampling signal SAMP is asserted to turn switch M1 ON to commence sampling of the input signal $I_{in}$ input to the non-inverting input of op amp OA3. The output of the op amp OA3 is allowed to charge the hold capacitor $C_H$ in such a way that the total voltage appearing at the gate of current storage MOS transistor M3 is whatever voltage is necessary to sustain its drain current, which is equal to $I_{in}$. The total voltage at the current storage MOS transistor M3 is represented by both the charge voltage $V_{CH}$ across the hold capacitor $C_H$ and the boost voltage $V_{CS}$ across the output voltage boost capacitor $C_S$.

$$V_{gate,M3} \cong V_{CH} + V_{CS}$$

$$\approx V_{CH} + V_{T,n}$$

$$= V_{CH} + 0.7v$$

Certain key results are to be noted. For instance, if the current storage MOS transistor M3 is a standard threshold device, it would require a gate voltage greater than $V_{T,n}$ (about 0.7 volts) in order to sustain appreciable current. The "boost" of the charge voltage $V_{CH}$ raises the 0 to 0.3 volt range output from the hold capacitor $C_H$ to a higher voltage range above the threshold voltage of the current storage MOS transistor M3 and thus to be within the operating range of the current storage MOS transistor M3. The gate voltage $V_{gate,M3}$ of the current storage MOS transistor M3 is boosted by about 0.7 volts as follows.

$$V_{gate,M3} \approx V_{CH} + V_{T,n} = V_{CH} + 0.7v$$

Thus, current storage MOS transistor M3 can be driven successfully when the charge voltage $V_{CH}$ across the hold capacitor $C_H$ is supplemented with the 0.7 volt boost voltage $V_{CS}$. Thus, the output drive of the disclosed sampling circuit is enhanced not by extending the range of voltages that switch M1 can pass, but rather by shifting that range to a more useful level with respect to driving current storage MOS transistor M3.

A common alternative to this approach involves boosting the voltage level at the gate of switch M1 to a level above the supply voltage. While this may extend the range of voltages that switch M1 can pass, it can only be accomplished if the relevant integrated circuit technology can avoid the breakdown which might occur when the gate voltage is at a level higher than that of the power supply. For advanced sub-micron processes such as 0.1 μm technology, a very low voltage power supply of 1 volt would essentially preclude such an option.

The parasitic capacitance of the gate of the current storage MOS transistor M3 will reduce the charge voltage $V_{CH}$ by charge sharing with the output voltage boost capacitor $C_S$. In this case, the reference voltage $V_X$ may be chosen to be closer in value to (or even equal to) ground potential to provide a higher boost voltage $V_{CS}$ pre-charged on the output voltage boost capacitor $C_S$. The output voltage boost capacitor $C_S$ should be chosen to be much greater in value than the parasitic capacitance of the gate of the current storage MOS transistor M3.

The range of the input current $I_{IN}$ and dimensions of the current storage MOS transistor M3 must be suitably chosen to correspond to the range of the allowable voltage input to the gate of the current storage MOS transistor M3, i.e., to remain within the range of $V_{CH}+V_{CS}$. The dynamic range of the low voltage current sampling circuit will then be essentially only limited by the gate-referred noise of the current storage MOS transistor M3 and the total available signal swing at the gate of the current storage MOS transistor M3. In the disclosed embodiment, this total available signal swing is about:

$$1.0v - 0.7v = 0.3v$$

The current storage MOS transistor M3 may be either a standard threshold or a low threshold voltage MOS transistor device. However, even if the current storage MOS transistor M3 is a low threshold voltage device as opposed to a standard threshold voltage device, this provides no particular advantage. For instance, if the current storage MOS transistor M3 has a lower or low threshold voltage of about 0.5 or 0.3 volts, respectively, then switch M4 should be replaced by an n-channel MOS transistor driven by control signal PR, and the reference voltage $V_x$ should be set to about zero volts. This will result in an available gate swing at the gate of the current storage MOS transistor M3 of between 0.3 volts and 0.6 volts, allowing operation but wasting the voltage range from about 0.6 to 1.0 volts.

Second Embodiment

Figure 3:
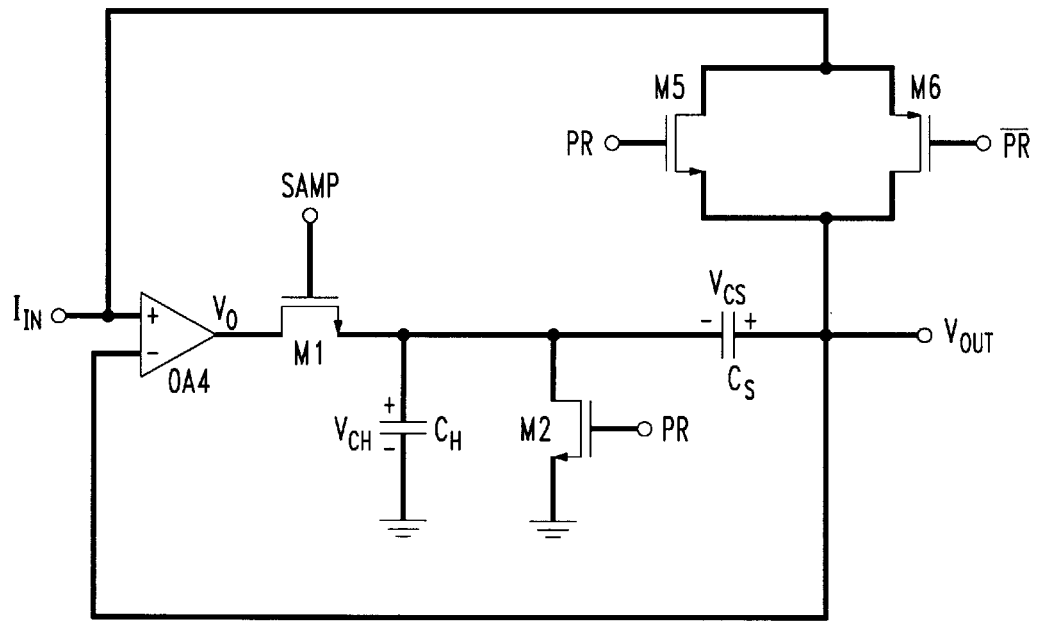
FIG. 3 shows, in a second embodiment of the present invention, a voltage sampling circuit for use with a very low voltage power supply.
Figure 4:
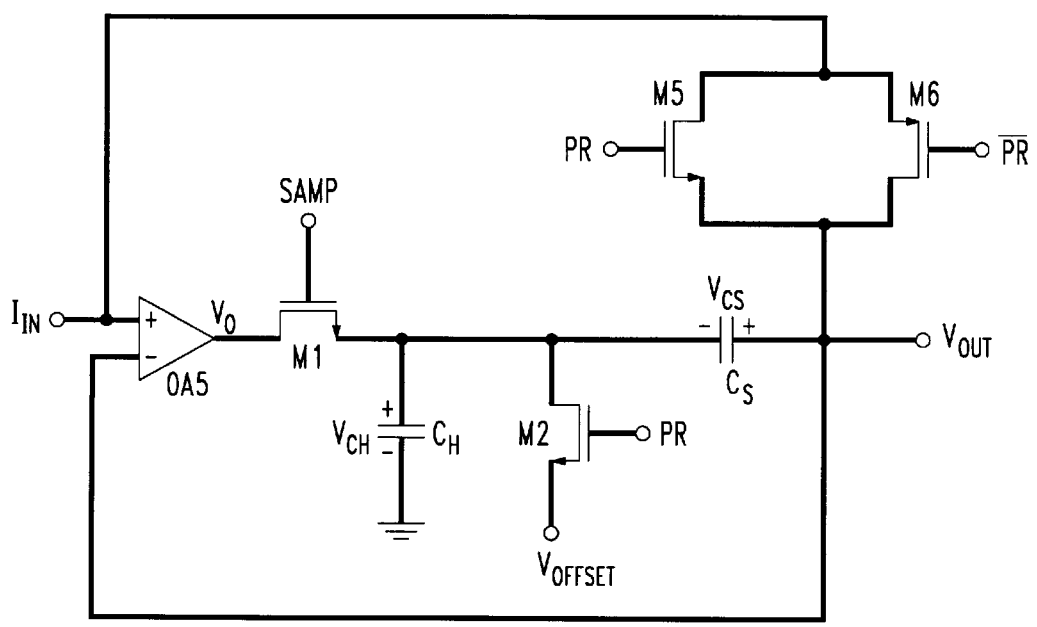
FIG. 4 shows, in an alternative to the second embodiment of the present invention, a voltage sampling circuit for use with a very low voltage power supply.

FIG. 3 shows a second embodiment of the invention, and FIG. 4 shows an alternative to the second embodiment.

In FIG. 3, an op amp OA4 receives an input voltage $V_{IN}$ to be sampled at its non-inverting input node. The inverting node of op amp OA4 is connected to the sample and hold circuit output voltage $V_{OUT}$. Op amp OA4 is a conventional device able to accept rail-to-rail input, e.g., 0 to 1 volt, with a 1 volt power supply.

The voltage sample and hold circuit shown in FIG. 3 further includes switches M1 and M2, a hold capacitor $C_H$, and an output voltage boost capacitor $C_S$ configured as in the circuit shown and described with respect to FIG. 1.

However, rather than switch M4, the circuit in FIG. 3 includes a parallel combination of an n-channel MOS transistor device M5 and a p-channel MOS transistor device M6, both operating as switches, and both connected between the positive node of the output boost voltage capacitor $C_s$ and the non-inverting input of the op amp OA4. Switch M5 is switched or operated under the control of the pre-charge signal PR, and switch M6 is switched under the control of the inversion of the pre-charge signal /PR. As shown, switch M2 is connected between the negative node of the output voltage boost capacitor $C_S$ and ground. Switches M5 and M6 are lower threshold voltage devices utilizing 0.35 μm integrated circuit technology exhibiting a voltage threshold of 0.5 volts for an n-channel device and 0.8 volts for a p-channel device.

During the pre-charge phase of the sampling, i.e., when the pre-charge signal is active, switch M1 is OFF. The voltage input $V_{IN}$ is passed through switches M5 and M6 to the positive node of the output voltage boost capacitor $C_S$, within the allowable transmission ranges of switches M5 and M6. For instance, for a range of input voltages $V_{IN}$ from 0 to 0.5 volts, the lower threshold voltage n-channel switch M5 conducts, and $V_{OUT}=V_{IN}$. For inputs from 0.8 volts to 1.0 volts, the lower threshold p-channel switch M6 conducts, and again $V_{OUT}=V_{IN}$. However, with a range of input voltages $V_{IN}$ from 0.5 volts to 0.8 volts, the output voltage $V_{OUT}$ is not equal to the input voltage $V_{IN}$ since neither switch M5 or M6 conducts.

Assuming that the output voltage boost capacitor $C_S$ is initially discharged using conventional means (not shown), if an input voltage $V_{IN}$ in the range between 0.5 and 0.8 volts is applied, switch M5 will charge the output to 0.5 volts, then slow down dramatically. For all intents and purposes, $V_{OUT}$ will pin to about 0.5 volts. We will have, therefore, the output voltage boost capacitor $C_S$ charged to a maximum of $V_{CS}=0.5$ volts.

During the sample phase, i.e., when the sampling signal SAMP is active, if the input voltage $V_{IN}$ fell to within the allowable pass voltage range of switches M5 and M6, then the output voltage $V_{OUT}$ would be equal to the input voltage $V_{IN}$, and the output voltage $V_O$ of the op amp OA4 would need to be about 0 for $V_{OUT}=V_{IN}$ to continue to be true. When the sampling signal SAMP goes to logic low, e.g., during the hold phase, the output of the sampling circuit is held at the desired voltage level, i.e., equal to the input voltage $V_{IN}$.

If the input voltage $V_{IN}$ is in the voltage range between 0.5 and 0.8 volts, then in order for the output voltage $V_{OUT}$ to be forced equal to the input voltage $V_{IN}$ during an active sampling signal SAMP, the op amp OA4 output would need to rise by an amount equal to $V_O=V_{IN}-0.5$ volts. The maximum value of the output voltage $V_O$ of the op amp OA4 is about 0.3 volts in this example, since inputs greater than about 0.8 volts would be conducted to the output successfully by switch M6 during the pre-charge phase PR. Switch M1 can handle $V_{OA}$ in the required range, so again the desired sample of the input voltage $V_{IN}$ is generated.

The following Table I summarizes the final, hold states for various levels of the input voltage $V_{IN}$.

TABLE I

| $V_{IN}$ | $V_{CH}$ | $V_{CS}$ | $V_{OUT}$ | M5 ON | M6 ON |
|---|---|---|---|---|---|
| 0.0 | 0.0 | 0.0 | 0.0 | Y | N |
| 0.1 | 0.0 | 0.1 | 0.1 | Y | N |
| 0.2 | 0.0 | 0.2 | 0.2 | Y | N |
| 0.51 | 0.01 | 0.5 | 0.51 | N | N |
| 0.79 | 0.29 | 0.5 | 0.79 | N | N |
| 0.80 | 0.0 | 0.8 | 0.80 | N | Y |
| 0.90 | 0.0 | 0.9 | 0.90 | N | Y |
| 1.00 | 0.0 | 1.0 | 1.00 | N | Y |

Note that in Table I the entries where the input voltage $V_{IN}$ is equal to 0.51 and 0.79 are in the range where switches M5 and M6 do not conduct.

The preceding analysis and Table I shows that for input voltages $V_{IN}$ which remain nearly constant from the end of the pre-charge stage PR to the end of the sampling signal SAMP, all input voltages $V_{IN}$ between 0 volts and 1 volt are in the allowable sampling range. However, if the input voltage $V_{IN}$ changes, modification of the circuit may be necessary. For example, if the input voltage $V_{IN}$ is decreasing, then op amp OA4 output voltage $V_O$ would have to be negative if the full value of the input voltage $V_{IN}$ was stored across the output voltage boost capacitor $C_S$ during the pre-charge stage PR. To accommodate for the changing values of the input voltage $V_{IN}$, the source of switch M2 should be connected to a non-zero voltage $V_{OFFSET}$ as shown in the alternative circuit shown in FIG. 4.

FIG. 4 shows an alternative to the circuit shown in FIG. 3. In FIG. 4, an op amp OA5, switches M1, M5 and M6, hold capacitor $C_H$, and output voltage boost capacitor $C_S$ are configured as described with respect to FIG. 3. However, the source of switch M2 shown in FIG. 4 is connected to an offset voltage $V_{OFFSET}$ rather than to ground as in FIG. 3. The offset voltage $V_{OFFSET}$ adjusts for the changes in the input voltage $V_{IN}$ and is chosen based on system requirements.

In explanation, presume that the output voltage boost capacitor $C_S$ is always initially discharged by conventional separate switches (not shown) between each of the output voltage boost capacitor $C_S$ and ground.

For an offset voltage $V_{OFFSET}$ chosen equal to 0.2 volts, Table II shows the results of the circuit shown in FIG. 4.

TABLE II

| $V_{IN}$ | $V_{CH}$ | $V_{CS}$ | $V_{OUT}$ | M5 ON | M6 ON |
|---|---|---|---|---|---|
| 0.1 | 0.2 | −0.1 | 0.1 | Y | N |
| 0.2 | 0.2 | 0.0 | 0.2 | Y | N |
| 0.5 | 0.2 | 0.3 | 0.5 | Y | N |
| 0.51 | 0.21 | 0.3 | 0.51 | N | N |
| 0.79 | 0.49 | 0.3 | 0.79 | N | N |
| 0.8 | 0.2 | 0.6 | 0.8 | N | Y |
| 0.9 | 0.2 | 0.7 | 0.9 | N | Y |
| 1.0 | 0.2 | 0.8 | 1.0 | N | Y |
| 0.0 | 0.2 | −0.2 | 0.0 | Y | N |

Here, the output voltage $V_O$ of op amp OA5 must be at least 0.2 volts for $V_{OUT}=V_{IN}$ at the end of the sampling signal SAMP. Thus, the input voltage $V_{IN}$ can fall by 0.2 volts between the end of the pre-charge stage PR and the end of the sampling signal SAMP without the op amp OA5 being required to drive $V_O$ negative. However, the opposite problem would then exist. In the entry in Table II for the input voltage $V_{IN}=0.79$ volts, it is seen that the charge voltage $V_{CH}$ must be essentially at its highest allowable value, i.e., at 0.49 volts, to successfully sample an input voltage $V_{IN}$ of 0.79 volts. If the input voltage $V_{IN}$ started at 0.79 volts at the end of the sampling signal SAMP, then rose to a higher voltage level, the sampling circuit would not be able to achieve $V_{OUT}=V_{IN}$ because the charge voltage $V_{CH}$ would need to be higher than switch M1 can accommodate.

The circuit of FIG. 4 adjusts for this change in the input voltage $V_{IN}$ during sampling by choosing an offset voltage $V_{OFFSET}$ equal to 0.1 volts in this example. The results of the circuit shown in FIG. 4 with an offset voltage $V_{OFFSET}$ equal to 0.1 volts is shown in Table III.

The value of the offset voltage $V_{OFFSET}$ is chosen based on the following general rules:

(1) The maximum amount by which the input voltage $V_{IN}$ can fall between the end of the pre-charge stage PR and the end of the sampling signal SAMP is equal to the offset voltage $V_{OFFSET}$.

(2) The maximum amount by which the input voltage $V_{IN}$ can rise between the end of the pre-charge stage PR and the end of the sampling signal SAMP is:

$$2V_{T,n}-(V_{T,p}+V_{OFFSET})$$

(3) For symmetrical operation, $V_{OFFSET}$ is chosen as follows.

$$V_{OFFSET} = V_{T,n} - \frac{V_{T,p}}{2}$$

Now suppose the sampling circuit of the present invention performs Nyquist sampling. In this case, the sampling period is $T_S$ seconds, so the maximum input frequency is ½Ts Hertz. The maximum slew rate for a sinusoidal input is:

$$\pi V_{SUPPLY}/2T_s \text{ volts/sec}$$

The maximum rise or fall of this sinusoidal input signal during the sampling stage pulse width τ is:

$$\frac{\tau \pi V_{RAIL}}{2T_S}$$

Setting this quantity equal to the chosen value of the offset voltage $V_{OFF}$ calculated above yields the condition for the duty cycle of the sampling pulse τ.

$$\frac{\tau}{T_S} \leq \frac{2V_{T,n} - V_{T,p}}{\pi V_{RAIL}}$$

For $V_{RAIL} \leq V_{T,n}+V_{T,p}$, this is the condition required for a dead zone in the switch transfer characteristic.

In this example, this yields $\tau/T_S=0.064$, i.e., the sampling pulse τ can be no more than 6.4% of the total sampling period $T_S$. This result is consistent with those of conventional sampling circuits.

Thus, the voltage sample and hold circuit according to the present invention allows a signal spanning the entire supply voltage to be sampled without resorting to either switch gate voltage bootstrapping or low threshold devices, which in turn allows implementation in very fine line (i.e., less than 0.1 μm) technologies with very low hold-mode droop.

Third Embodiment

Figure 5A:
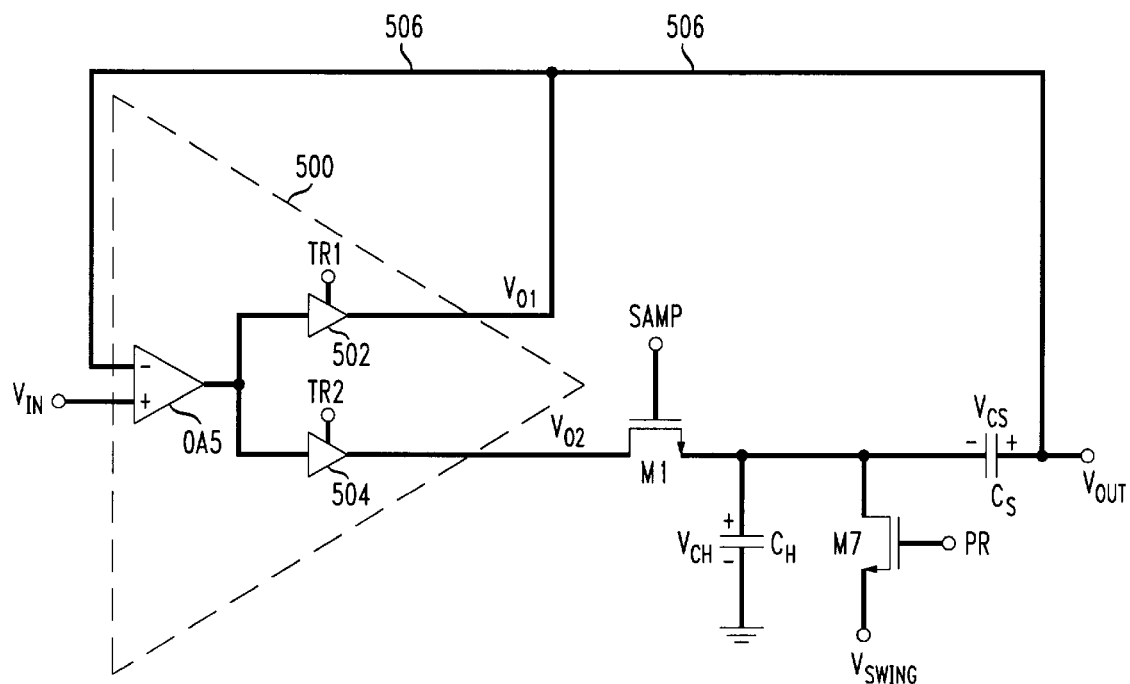
FIG. 5A shows, in a third embodiment of the present invention, a voltage sampling circuit for use with a very low voltage power supply.

FIG. 5A shows a third embodiment of the present invention, which is an improvement to the switched op amp configuration described previously with respect to the circuit of FIG. 8.

FIG. 5A shows a switched amplifier 500 comprising an op amp OA5 and two tri-state buffers 502, 504 forming separate output stages which tri-state the output of the op amp OA5 under the control of tri-state control signals TR1, TR2, respectively. The tri-state buffers 502, 504 enter a high-impedance output tri-state mode when the tri-state control signals TR1, TR2 go to a logic HIGH. The tri-state buffers 502, 504 pass their input signal when the tri-state control signals TR1, TR2 go to a logic LOW, i.e., place their outputs in a high impedance state. Of course, other types of tri-state buffers, other logic components, and/or devices having logic states different from those disclosed in the present embodiment may be implemented. The first tri-state buffer 502 controls the feedback path of the output of the op amp OA5 back to the inverting input of the op amp OA5. The second tri-state buffer 504 controls the passage of the output of the op amp OA5 to switch M1.

An output voltage boost capacitor $C_S$ boosts the level of the voltage of the hold capacitor $C_H$ similar to previous embodiments. Here, however, the positive node of the output voltage boost capacitor $C_S$ is charged directly by the voltage $V_{O1}$ output from the op amp OA5. The positive node is charged to the level of the output of the op amp OA5 when the first tri-state buffer 502 is not tri-stated. An n-channel MOS transistor device M7 operating as a switch is connected between the negative node of the output voltage boost capacitor $C_S$ and a reference swing voltage $V_{SWING}$. Switch M7 is controlled by the pre-charge signal PR.

Figure 5B:
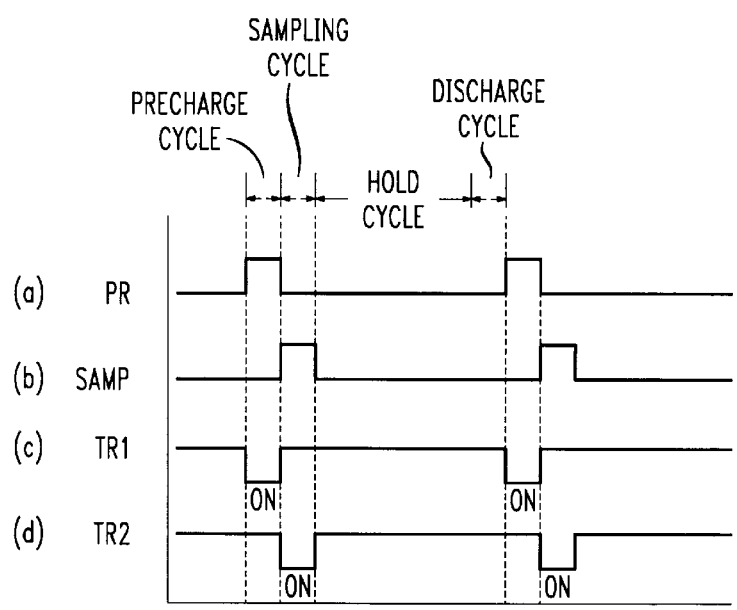
FIG. 5B is a timing diagram for the circuit shown in FIG. 5A.
Figure 6A:
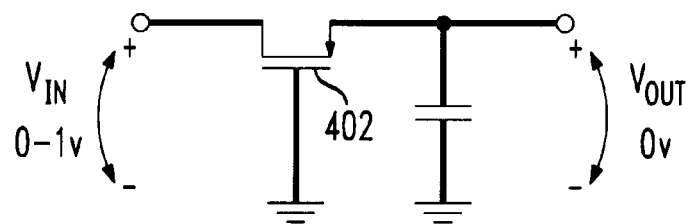
FIG. 6A shows a conventional circuit using a p-channel MOSFET device as a switch in a circuit utilizing a very low power supply voltage.
Figure 6B:
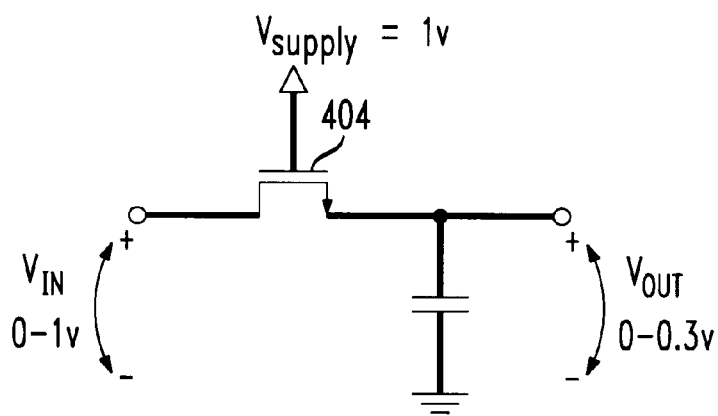
FIG. 6B shows a conventional circuit using an n-channel MOSFET device as a switch in a circuit utilizing a very low power supply voltage.
Figure 7:
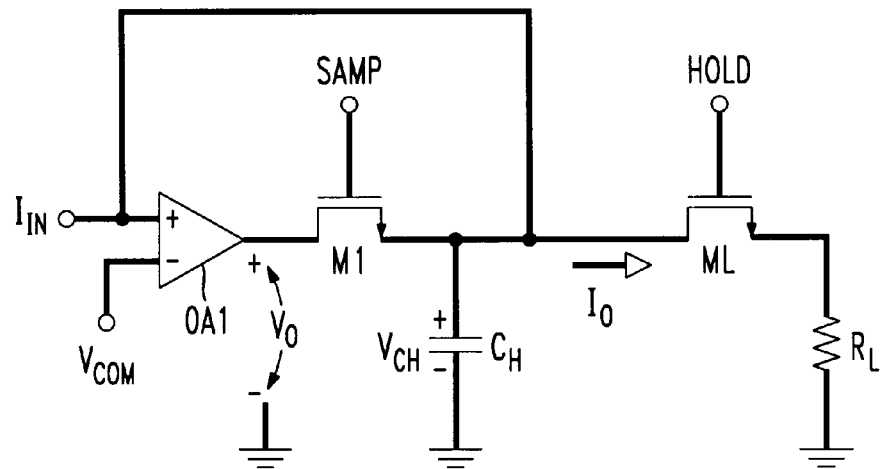
FIG. 7 shows a conventional current sampling circuit.

FIG. 5B is a timing diagram showing the timing of control signals in the circuit of FIG. 5A during the pre-charge, sampling, hold and discharge cycles. In particular, FIG. 5B shows the pre-charge signal PR, the sampling signal SAMP, and the first and second tri-state signals TR1 and TR2, which control aspects of the circuit shown in FIG. 5A.

During the pre-charge cycle, waveform (a) of FIG. 5B shows that the pre-charge signal PR is at a logic high and thus turns switch M7 ON. At this time, the sampling signal SAMP is low as shown in waveform (b) of FIG. 5B, and thus turns switch M1 OFF. Also during the pre-charge cycle, the first tri-state signal TR1 is low as shown in waveform (c) of FIG. 5B, allowing the first tri-state buffer 502 to pass the output from op amp OA5 to the positive node of the output voltage boost capacitor $C_S$. This charges the positive node to the level of the output voltage $V_{O1}$. Waveform (d) of FIG. 5B shows that the second tri-state signal TR2 is high during the pre-charge cycle thus tri-stating the output of the second tri-state buffer 504.

When in the pre-charge cycle, the first tri-state buffer 502 is allowed to pass its input signal and the op amp OA5 is configured as a non-inverting unity gain amplifier. The output voltage $V_{OUT}$ is forced equal to the input voltage $V_{IN}$ via the feedback loop 506, and the charge voltage $V_{CH}$ across the hold capacitor $C_H$ is set equal to the swing voltage $V_{SWING}$. This produces a voltage across the output voltage boost capacitor $C_S$ of approximately $V_{CS} = V_{IN} - V_{SWING}$.

During the sampling cycle the pre-charge signal PR is low, turning switch M7 OFF and halting the charging of the negative node of the output voltage boost capacitor $C_S$. The sampling signal SAMP is high during the sampling cycle to turn switch M1 ON, and the second tri-state buffer 504 is turned ON by tri-state signal TR2, to allow the output voltage $V_{O2}$ of the op amp OA5 to charge the hold capacitor $C_H$. The first tri-state signal TRI tri-states the first tri-state buffer 502 during the sampling cycle to place its output in a high impedance state.

When in the sampling cycle, the first tri-state buffer 502 tri-states its output to a high impedance state and the second tri-state buffer 504 allows its input signal to pass. Since the charge voltage $V_{CH}$ was equal to the swing voltage $V_{SWING}$ and the output voltage $V_{OUT}$ becomes equal to the input voltage $V_{IN}$ in the pre-charge phase, the op amp OA5 must again produce the same voltage at its output to maintain $V_{OUT} = V_{IN}$. If however the act of shutting OFF the first tri-state buffer 502 somehow corrupted the charge voltage $V_{CS}$ so that the output $V_{OUT}$ no longer equals the input voltage $V_{IN}$, the feedback loop through the second tri-state buffer 504 can correct for any corruption to the charge voltage $V_{CH}$ to restore $V_{OUT} = V_{IN}$ by moving the charge voltage $V_{CH}$ above or below the swing voltage $V_{SWING}$ as necessary.

For example, if switch M1 has a lower threshold voltage of 0.5 volts, then the swing voltage $V_{SWING}$ can be set to 0.25 volts, allowing a +/−0.25 volt correction to the charge voltage $V_{CH}$. For a supply voltage of 1.0 volt, this is half the entire signal range which is a very substantial error correction capability.

The hold cycle represents a period of time when the sampled input output by the sample and hold circuit is stable and can be utilized by subsequent circuitry. During the hold cycle, the pre-charge signal PR is low turning switch M7 OFF, the sampling signal SAMP is low turning switch M1 OFF, and both tri-state signals TRI and TR2 are HIGH to tri-state the outputs of the first and second tri-state buffers 502, 504.

The output voltage boost capacitor $C_S$ is charged during the pre-charge cycle to a level equal to the output voltage $V_{O1}$ of the op amp OA5 minus the swing voltage $V_{SWING}$. The hold capacitor $C_H$ is charged during the sampling cycle to the level of the input voltage $V_{IN}$. Both the output voltage boost capacitor $C_S$ and the hold capacitor $C_H$ maintain their charge during the hold cycle, and are discharged during the discharge cycle by switched connections to ground (not shown).

Thus, the third embodiment of the present invention adds a second step to the sampling of an input signal, i.e., tri-state output stages for the op amp OA5 to correct the potentially large error that may be produced when the output stage of a conventional switched op amp is tri-stated.

The hold capacitor $C_H$ and the output voltage boost capacitor $C_S$ can be non-linear capacitors, e.g., MOS gate capacitors. The value of the hold capacitor $C_H$ depends upon other system considerations such as thermal noise requirements and the desired bit-level accuracy. The embodiments disclosed herein relate to a 10 or 11 bit accuracy in output. The output voltage boost capacitor is 1 picofarads (pF) in the disclosed embodiments, which is suitably steady for about a 10 bit accuracy in output.

Although lower or even low threshold devices can be used in the circuit of FIG. 5A, output droop of the low voltage sample and hold circuit will be improved with the use of standard threshold voltage devices.

The present invention improves the accuracy of sampling circuits operating with very low power supplies because it improves the OFF-state leakage and output droop usually associated with conventional devices operating with this low power supply. The present invention also improves the range of the output of the sampling circuit.

While the invention has been described with reference to the exemplary preferred embodiments thereof, those skilled in the art will be able to make various modifications to the described embodiments of the invention without departing from the true spirit and scope of the invention.

I claim:

1. A sampling circuit, comprising:
   a switched amplifier having a first output and a second output;
   an output voltage boost capacitor in communication with said first output of said switched amplifier; and
   a pre-charge circuit to pre-charge said output voltage boost capacitor to offset an output voltage of said second output of said switched amplifier.

2. The sampling circuit according to claim 1, wherein:
   said first output and said second output of said switched amplifier are switched.

3. The sampling circuit according to claim 2, wherein:
   said switched first and second outputs of said switched amplifier operate independent of one another.

4. The sampling circuit according to claim 2, wherein:
   said first switched output and said second switched output are each switched tri-state outputs.

5. The sampling circuit according to claim 1, wherein:
   said pre-charge circuit pre-charges a node of said output voltage boost capacitor to a voltage level output from said first output of said switched amplifier.

6. The sampling circuit according to claim 1, further comprising:
   a hold capacitor in communication with said switched amplifier.

7. The sampling circuit according to claim 6, wherein:
   said hold capacitor is in communication with said second output of said switched amplifier.

8. The sampling circuit according to claim 6, wherein:
   said pre-charge circuit pre-charges a node of said output voltage boost capacitor to a voltage level pre-charged on said hold capacitor.

9. The sampling circuit according to claim 6, wherein:
   said hold capacitor is a non-linear capacitor.

10. The sampling circuit according to claim 1, wherein:
    said sampling circuit automatically corrects for any error in an output of said sampling circuit due to switching of at least one of said first output and second output of said switched amplifier.

11. The sampling circuit according to claim 1, wherein:
    said output voltage boost capacitor is a non-linear capacitor.

12. A sampling circuit for operation with a very low power supply, comprising:
    sample and hold means, comprising a switched amplifier having a first output and a second output, for sampling and holding an output of said sampling circuit;
    output boost means in communication with said first output of said switched amplifier, to boost said output of said sampling circuit; and
    pre-charging means to pre-charge said output boost means to offset an output voltage of said second output of said switched amplifier.

13. A method of sampling an input signal, comprising:
    pre-charging an output voltage boost capacitor to a boost voltage level;
    switching a first output of a switched amplifier to a first state to charge a hold capacitor;
    switching said first output of said switched amplifier to a second state to allow said hold capacitor to hold a charge; and
    boosting said output of said switched amplifier by said boost voltage level to provide an output signal.

14. The method of sampling according to claim 13, further comprising:
    operating a second output of said switched amplifier independently of said first output of said switched amplifier.

15. The method of sampling according to claim 14, further comprising:
    feeding said second output of said switched amplifier back to a non-inverting input of said switched amplifier.

16. The method of sampling according to claim 13, wherein said pre-charging comprises:
    pre-charging a node of said output voltage boost capacitor to a voltage level output from said first output of said switched amplifier.

17. The method of sampling according to claim 13, wherein said pre-charging comprises:
    pre-charging a node of said output voltage boost capacitor to a voltage level pre-charged on said hold capacitor.

18. The method of sampling according to claim 13, further comprising:
    automatically correcting for any error in said output signal due to switching of said first output of said switched amplifier.

19. The method of sampling according to claim 5, wherein said pre-charging comprises:
    pre-charging a node of said output voltage boost capacitor to a voltage level selected to allow a range of correction to said output signal.

20. A sampling circuit, comprising:
    a switched amplifier having a first output and a second output;
    an output voltage boost capacitor having a first node operably connected to said first output; and
    a pre-charge circuit operably connected to a second node of said output voltage boost capacitor to pre-charge voltage across said output voltage boost capacitor to approximately the difference between output voltage of said first output and a reference swing voltage.

21. The sampling circuit in accordance with claim 20, wherein:
    said pre-charging circuit comprises:
    a switch being controlled by a pre-charge signal.

22. The sampling circuit in accordance with claim 20, further comprising:
    a hold capacitor having a first node being operably connected to said second node of said output voltage boost capacitor and a second node being operably connected to ground;
    a switch positioned between a first node of said hold capacitor and said second output of said switched amplifier, and being controlled by a sample signal to charge said hold capacitor with output voltage of said second output of said switched amplifier.

23. The sampling circuit in accordance with claim 20, wherein:
    an input of said switched amplifier is operably connected to said first output of said switched amplifier to provide a unity gain amplifier.

24. the sampling circuit in accordance with claim 20, wherein:
    said switched amplifier comprises:
    an op-amp;

a first tri-state buffer having an input and an output, said input of said first tri-state buffer being operably connected to an output of said op-amp, said output of said first tri-state buffer being said first output of said switched amplifier; and a second tri-state buffer having an input and an output, said input of said second tip-state buffer being operably connected to said output of said op-amp, said output of said second tri-state buffer being said second output of said switched amplifier.

25. The sampling circuit in accordance with claim 20, further comprising:

a discharge circuit to discharge said hold capacitor and said output voltage boost capacitor.

26. The sampling circuit in accordance with claim 20, wherein:

said hold capacitor is a non-linear capacitor.

27. The sampling circuit in accordance with claim 20, wherein:

said output voltage boost capacitor is a non-linear capacitor.

28. A sampling circuit, comprising:

a switched amplifier, comprising:

an op-amp;

a first tri-state buffer having an input being operably connected to an output of said op-amp and an output to provide a first output of said switched amplifier, and a second tri-state buffer having an input being operably connected to said output of said op-amp and an output to provide a second output of said switched amplifier, wherein said first output being operably connected an input of said op-amp to provide a unity gain amplifier;

an output voltage boost capacitor having a first node being operably connected to said first output of said switched amplifier;

a pre-charge circuit connected to a second node of said output voltage boost capacitor to pre-charge voltage across said output voltage boost capacitor to approximately the difference between output voltage of said first output and a reference swing voltage;

a hold capacitor having a first node being operably connected to said second node of said output voltage boost capacitor and a second node being operably connected to ground; and a switch positioned between a first node of said hold capacitor and said second output of said switched amplifier.

* * * * *